United States Patent [19]

Ling

[11] Patent Number: 6,138,606
[45] Date of Patent: Oct. 31, 2000

[54] ION IMPLANTERS FOR IMPLANTING SHALLOW REGIONS WITH ION DOPANT COMPOUNDS CONTAINING ELEMENTS OF HIGH SOLID SOLUBILITY

[75] Inventor: Peiching Ling, San Jose, Calif.

[73] Assignee: Advanced Materials Engineering Research, Inc., Sunnyvale, Calif.

[21] Appl. No.: 09/059,532

[22] Filed: Apr. 13, 1998

Related U.S. Application Data

[63] Continuation-in-part of application No. 08/514,757, Aug. 14, 1995, Pat. No. 5,863,831.

[51] Int. Cl.[7] .............................. C23C 16/00; H01J 27/00
[52] U.S. Cl. ................. 118/723 E; 118/715; 315/111.81
[58] Field of Search ............................... 118/715, 723 FI, 118/723 E; 315/111.81, 111.21, 116, 117; 313/359, 360, 361, 362, 363, 36, 240, 217, 209; 250/423 R; 204/298.04, 298.05, 298.06, 298.13

[56] References Cited

U.S. PATENT DOCUMENTS

| | | | |
|---|---|---|---|
| 3,955,118 | 5/1976 | Flemming | 313/36 |
| 4,377,773 | 3/1983 | Hershcovitch et al. | 315/111.81 |
| 4,941,430 | 7/1990 | Watanabe et al. | 204/298.06 |
| 5,288,386 | 2/1994 | Yanagi et al. | 204/298.06 |

*Primary Examiner*—Gregory Mills
*Assistant Examiner*—Parviz Hassanzadeh
*Attorney, Agent, or Firm*—Bo-In Lin

[57] ABSTRACT

An ion source apparatus is disclosed in this invention. The ion source apparatus includes an anode having an interior space for containing a plasma and an opening into the space. The ion source apparatus further includes a hollow cathode within the space. The ion source apparatus further includes a dopant ion-source composed of compounds comprising element selected from a group of elements consisting of silicon and germanium, the dopant ion-source disposed next to the space. The ion source apparatus further includes a voltage means connected to the anode, the hollow cathode, and the dopant ion source for discharging a plasma into the space for bombarding the dopant ion source for generating a dopant ion compound. The ion source apparatus further includes an ion-beam extracting means for extracting the dopant ion compound through the opening. In an alternate preferred embodiment, the ion source apparatus employs an electron beam device to generate the dopant ion compound. In yet another preferred embodiment, the ion source apparatus employs an ion beam device for generating the dopant ion compound.

14 Claims, 4 Drawing Sheets

ION IMPLANTERS FOR IMPLANTING SHALLOW REGIONS WITH ION DOPANT COMPOUNDS CONTAINING ELEMENTS OF HIGH SOLID SOLUBILITY

This patent application is a Continuation-in-Part (CIP) application of a prior application Ser. No. 08/514,757 filed on Aug. 14, 1995 U.S. Pat. No. 5,863,831.

BACKGROUND OF THE INVENTION

1. Field of the Invention

The invention relates generally to the ion implantation systems and methods employed in the fabrication process for manufacturing semiconductor devices. More particularly, this invention relates to the implantation systems and fabrication process for manufacturing semiconductor devices that include shallow p-type or n-type regions.

2. Description of the Prior Art

As the overall dimensions of semiconductor devices are miniaturized and made ever smaller, it is often required to form very shallow p-doped regions. These shallow p-regions might have junction depth less than quarter-micron. Difficulties arising from satisfying requirements to form such shallow p-type regions, however, often become a major limiting factor in the fabrication process to further shrink the size of the semiconductor devices. This is a common situation faced by those skilled in the art in making metal oxide semiconductor field-effect transistors (MOSFET) and complementary metal oxide semiconductor (CMOS) devices. As will be further explained below, the conventional techniques, which apply a conventional ion implantation system with ion source well known in the art, are not able to resolve these difficulties encountered in the semiconductor industry.

The method used to make these vital CMOS and MOSFET transistors involves the formation of n-type and p-type-doped regions, most frequently by ion implantation. Shallow n-doped regions can easily be formed by the ion implantation of arsenic or other n-type dopants. However, technical difficulties currently hamper the formation of very shallow p-doped regions. In most semiconductor fabrication processes the dopant boron is used to form p-type regions. Because boron has a very low atomic number (Z=5), a very low implantation energy must be used to keep the dopant in the shallow surface region necessary for small geometry devices. Even those different kind of implantation systems are well known and commonly used, however, traditional techniques of ion implantation are limited in their ability to produce low Z dopants with very low implantation energies. These limitations effect both the stability and reliability of shallow p-junctions. Furthermore, due to its low atomic number, implanted boron tends to channel through crystalline substrates and therefore forms a very undesirable, deep, 'implantation profile tail', in which the concentration of the dopant can not be accurately controlled. This 'channeling tail' creates great difficulties in the ability to clearly define the junction depth of boron implanted shallow p-type regions. This inability to control the junction depth seriously degrades device performance. All in all, it is not feasible to use conventional low energy implantation technology to implant boron and form shallow p-regions for very-large scale integrated (VLSI) circuits.

Several techniques are currently used to try to reduce the technical difficulties associated with low energy boron implantation. In one case, the technique involves implanting a heavier compound ion, i.e., BF2, to form the shallow p-region. Due to the higher mass of the compound, the constituent atoms of the $BF_2$ ion have a shallower penetration depth for a given ion energy, thus enabling the formation of shallower p-type regions. The $BF_2$ ions provide another key advantage because they help reduce problems caused by a channeling-effect This improvement is accomplished by the increased crystal damage caused by the heavier fluorine component of the compound ion. However, since fluorine is neither a p-type nor a n-type dopant, the fluorine atoms that are introduced from the BF2 ions do not directly contribute to the electrical performance of the semiconductor device.

The implantation of fluorine from the $BF_2$ compound generates a new set of problems. Due to their low solubility in silicon, the fluorine atoms tend to migrate, particularly if the substrate is heated. After a $BF_2$ implantation, any subsequent fabrication process, which uses elevated temperatures, will tend to cause the implanted fluorine to migrate to the silicon surface, i.e., silicon-oxide interface. In some cases, this migration may cause the fluorine to coalesce and form a gap at the interface. Several different contact problems can be caused by migrating fluorine including; poor contact reliability, high contact resistance, and unstable electrical performance.

In addition to the contact problems caused the migration of fluorine, implantation of $BF_2$ ions with energies less than 15 KeV can be difficult. This difficulty in turn limits the minimum depth of implantation and thus limits the miniaturization of integrated circuit (IC) devices in VLSI and ULSI applications.

Several types of ion implantation systems with different ion sources to produce different ion beams are available for performing the above discussed ion implantation operations. In an earlier U.S. Pat. No. 3,955,188 by Flemming, entitled "Cold-cathode Ion Source" (issued on May 4, 1976), a cold cathode ion source is disclosed. Gases are introduced into a vacuum chamber. Specially shaped hollow anode and cathode electrodes are applied to produce a plasma discharge. The system can also be implemented with a solid feed of source. An oven anode with cavities can be applied to vaporize the solid source. In U.S. Pat. No. 5,148,034 entitled "Ion Implantation Method" (issued on Sep. 15, 1992), Koike discloses a method of ion implantation for semiconductor devices to neutralize charge stored on a wafer. The ion implantation system includes ion extracting, analyzing, accelerating, focusing, and deflecting sections. The ion implantation system further includes an ion impinging section for impinging a positive ion beam on particular positions on the wafers. In U.S. Pat. No. 5,178,739, entitled "Apparatus for Depositing Material into High Aspect Ratio Holes", Barnes et al. disclose a sputter deposition system where radio-frequency (RF) energy is applied in a vacuum chamber to produce charged plasma particles. Magnetic guiding system are then implemented to direct the ion beams into holes with high aspect ratio. In another U.S. Pat. No. 5,089,710, entitled "Ion Implantation Equipment" by Kikuchi et al. wherein ion implantation equipment for implanting ion beam into an implanting target is disclosed. Plasma is generated and electron beam generated by the plasma is induced to an ion beam. The ion implantation system includes a Faraday for enclosing the ion beam before the implanting target. A plasma generation chamber shares a common wall surface with the Faraday. A variable bias voltage is then applied to the Faraday to direct the electron beam generated from an electron discharge source. In another U.S. Pat. No. 5,482,611, entitled "Physical Vapor Deposition Employing Ion Extraction From a Plasma", (issued on Jan. 9, 1996), Helmer et al. disclose a sputter magnetron ion source for producing an intense plasma. The plasma is produced in a cathode container where a high percentage of sputter cathode material is vaporized. An extracting means is implemented to extract the ions of the cathode material in a beam. A magnetic cusp is implemented to form this ion extracting means.

Other than the above ion beam producing and ion implantation systems, there is a different type of ion beam producing system where the ion beams are produced by bombarding a target with a low-work-function surface. In U.S. Pat. No. 4,377,773, Hershcovitch et al. disclose a negative ion source formed by bombarding a low-work-function surface with positive ions and neutral particles from a plasma. The highly ionized plasma is injected into an anode space containing the low-work-function surface. The plasma is formed by hollow cathode discharge and the plasma is injected into the anode space along the magnetic field. The negative ion source is of the magnetron types.

As the implantation systems disclosed in the prior art Patents can be employed to carry out the invention disclosed in this invention, the subject matters disclosed and discussed in U.S. Pat. Nos. 3,955,118, 4,377,773, 5,178,739, 5,178,743, 5,089,710, 5,343,047, 5,148,034, and 5,482,611 are incorporated herein in this Application by reference. However, even that different types of implantation systems are available, the difficulties and limitations faced by the semiconductor industry in forming a shallow p-type region still are a major hindrance to device miniaturization and reliability improvement.

In addition to the difficulties for implanting the p-type dopant ions as described above, similar difficulties may also arise in forming the shallow n-type regions. Current technology of implanting n-type regions with ion dopant compounds containing phosphorous and arsenic is adequate because the heavier weight of phosphorous, arsenic, and other kinds of n-type elements. Thus, n-type dopant compounds do not have the same difficulties as that encountered in the p-type dopants for implanting shallow regions. However, further scale down of the integrated circuit (IC) devices in the near future will certainly require the n-type regions to have shallower junctions. Therefore, when n-type regions with smaller junction depths than the current requirements become necessary, same difficulties, similar to that for forming a shallow p-type region, would also be limiting to the manufacture of IC devices.

For all the above reasons, traditional techniques of employing $BF_2$ as source of ion implantation using any types of ion implantation systems as described above is not a viable solution for the difficulties currently associated with the fabrication of shallow p-type and n-type regions. There is a profound need in the art of IC device fabrication, to provide new implantation system using new implanting sources, particularly for devices requiring shallow p-type and n-type regions, to resolve these difficulties and limitations by new fabrication equipment and methods.

SUMMARY OF THE PRESENT INVENTION

It is therefore the object of the present invention to provide a new fabrication process by using an implantation system with particular types of implanting source to from shallow p-type and n-type regions in semiconductor devices. The implantation system with novel implant ion-sources will enable those of ordinary skill in the art to overcome the difficulties, encountered in the prior art.

Specifically, it is an object of the present invention to present a method for introducing a p-type dopant by using an ion implantation system with special type of implanting sources to form shallow p-type and n-type regions. The method provides a fabrication process that can be controlled to produce a doped region with a well defined, reproducible shallow-depth and has a uniform diffusion profile.

Another object of the present invention is to provide a method for the introduction of a ion dopant compound by using an ion implantation system with special type of implanting sources to form shallow p-type and n-type regions. The method provides a fabrication process to form doped regions of reduced depth while retaining the ability to form contacts at the surface of the substrate which can be made with strong adhesion, low contact resistance, and predictable, well-defined device performance characteristics.

Another object of the present invention is to provide a method for introduction of an ion dopant compound by using an ion implanter with special type of implanting sources to form shallow p-type and n-type regions. The method provides a fabrication process to form the shallow-depth implanted regions wherein the epitaxial growth at the interface between silicon and silicon-containing aluminum alloy may be reduced.

Briefly, in a preferred embodiment, the present invention discloses an ion source apparatus, which includes an anode having an interior space for containing the plasma and an opening into the space. The ion source apparatus further includes a hollow cathode within the space. The ion source apparatus further includes an ion-source composed of compounds comprising element selected from a group of elements consisting of silicon and germanium, the ion dopant source is disposed next to the space. The ion source apparatus further includes a voltage means connected to the anode, the hollow cathode, and the p-type ion source for discharging the plasma into the space for bombarding the p-type ion source for generating a p-type ion compound. The ion source apparatus further includes an ion-beam extracting means for extracting the ion dopant compound through the opening. In a preferred embodiment, the anode and the cathode with the voltage means are formed as an ion source of a magnetron type. The dopant ion-source may be a p-type or a n-type dopant ion-source. The dopant ion-source may be a solid dopant ion-source. In a preferred embodiment, the dopant ion-source is a boron germanium dopant ion-source. In a preferred embodiment, the dopant ion-source is a boron silicon dopant ion-source. In another preferred embodiment, the dopant ion-source is a phosphorous germanium dopant ion-source. In another preferred embodiment, the dopant ion-source is a phosphorous silicon dopant ion-source. In another preferred embodiment, the dopant ion-source is a arsenic germanium dopant ion-source. In another preferred embodiment, the dopant ion-source is a arsenic silicon dopant ion-source. In another preferred embodiment, the dopant ion-source is a composite dopant ion-source defined by $A_xC_y$ wherein A representing an acceptor or donor and C representing an element forming a solid solution in a substrate with a solid solubility higher than a solid solubility of a fluorine ion in the substrate, and x and y are real numbers. In another preferred embodiment, the dopant ion-source is a composite dopant ion-source defined by $A_xC_y$ wherein A representing an acceptor or donor and $A_xC_y$ representing a compound of $A_xSi_{y1}Ge_{y2}$ where x, y1 and y2 are real numbers. In another preferred embodiment, the dopant ion-source is a composite dopant ion-source defined by $A_xC_y$ wherein A representing an acceptor or donor and $A_xC_y$ representing a compound of $B_xSi_y$ where x and y are real numbers.

This invention also discloses other types of ion source apparatuses. A first ion source apparatus includes a dopant ion-source composed of compounds comprising element selected from a group of elements consisting of silicon and germanium. The ion source apparatus further includes an electron beam device for injecting an electron beam to the dopant ion-source for generating a dopant ion compound. The ion source apparatus further includes an ion-beam extracting means for extracting the dopant ion compound through the opening. This invention further discloses, as another preferred embodiment, an ion source apparatus, which includes a dopant ion-source composed of compounds comprising element selected from a group of elements consisting of silicon and germanium. The ion source apparatus further includes an ion-beam device for injecting an ion beam to said dopant ion-source for generating a dopant ion compound. The ion source apparatus further includes an ion-beam extracting means for extracting said dopant ion compound through said opening. These two kinds of ion source apparatuses may also employ other kinds or ion sources as described in the above hollow cathode ion source apparatus.

These and other objects and advantages of the present invention will no doubt become obvious to those of ordinary skill in the art after having read the following detailed description of the preferred embodiment which is illustrated in the various drawing figures.

DESCRIPTION OF THE PREFERRED EMBODIMENT

Figure 1:
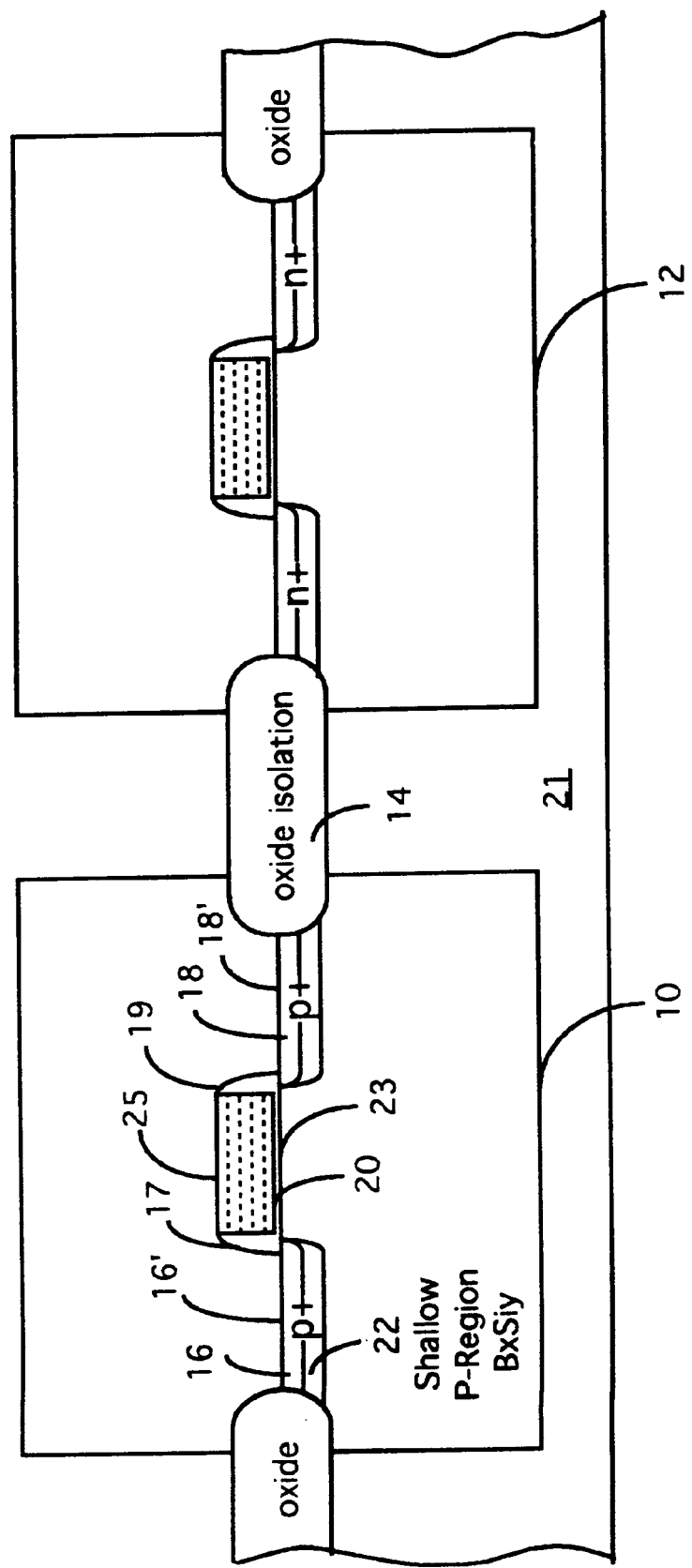
FIG. 1 is an enlarged cross-sectional view of a typical MOSFET device.

The present invention teaches implantation systems and fabrication process which takes advantage of a fundamental physical phenomenon relating to 'solid solubility'. Specifically, when different types of atoms, either as a single element or as part of a compound, are introduced into a solid substrate, each type of these 'alien' atoms introduced into the substrate has a solid solubility limit, i.e., a maximum concentration of that atom which the substrate can accommodate. When the concentration of these 'alien' atoms exceeds the limit of solid solubility into the substrate, certain micro structural defects are formed. These defects then affect the targeted electrical properties of the doped regions in the semiconductor devices, which in turn adversely impact device performance and reliability.

The difficulties of forming a shallow P type region in the semiconductor devices can be better appreciated now based on the above mentioned problems associated with the defects when solid solubility limits are exceeded. In order to form a P type region the acceptor elements, i.e., atoms such as boron, aluminum, gallium, indium, yttrium, etc., are introduced into a substrate. Among these elements, only boron has sufficient high solid solubility in a silicon substrate. However, since the boron atom itself is a very light atom, it is difficult to form a shallow layer by using boron atom alone as a dopant In order to increase the weight of ions implanted into the substrate, compounds of boron are formed for implantation to reduce the depths of the doped regions. The most commonly used compound for forming the shallow P regions in the conventional fabrication process is the $BF_2$ compound wherein the fluorine atoms are added to increase the weight of the implanted ions thus reducing the depth of doped regions. However, since the fluorine atoms have a relative low solid solubility in the silicon substrate, as soon as the fluorine atomic concentration exceeds its solid solubility, the problems associated with micro structural defects occur.

Therefore, when the dopant compound $BF_2$ is implanted into a substrate to form a shallow P-type region, the solid solubility of each atom introduced into the substrate as part of the compound, i.e., the solubility of boron atoms and fluorine atoms, becomes an important parameter. The solid solubility is important in determining the material behaviors resulted from the doping operation. Since the boron atoms have high solid solubility in a silicon substrate, no particular problems are generated. But, as the concentration of one type of alien atoms, e.g., the fluorine atoms, introduced as part of the compound, exceed its solubility in the substrate, this type of atoms generate structural defects in the substrate. The defects caused by these alien atoms lead to problems such as segregation, precipitation, diffusion to surface, dislocation and bubbles. As this is the major problem encountered for fabricating the shallow p-type regions in the conventional $BF_2$ implantation process, the main subject of the present invention is to teach a material processing technique to overcome this problem. With the new material processing technique, the doping quality is improved by employing dopant-compounds, which composed of atoms of high solid solubility in the substrate. The concentration for each element is kept below the solid solubility of that atom by carefully selecting dopant compounds and by controlling the atomic concentrations for each of the elements in that compound introduced into the substrate. The defects are eliminated and the problems encountered in a conventional technique, e.g., $BF_2$ implantation, for forming shallow P regions are resolved.

FIG. 1 shows a cross-sectional view of a typical MOSFET device including a chip, i.e., a silicon substrate 21, with two transistors 10 and 12, i.e., a p-type transistor 10 and a n-type transistor 12 formed thereon. The transistors 10 and 12 are isolated from each other by an oxide strip 14, which is preferably a silicon dioxide strip. The transistors 10 and 12 and the isolation strips are shown as an example. For those of ordinary skill in the art, it is well known that a great number of transistors separated by isolation oxide regions may be formed on a silicon chip. The description of the transistor structure will be focused of the p-type transistor for understanding the novel features of the present invention.

Referring to FIG. 1 for the p-type transistor 10, which includes a pair of p-doped source and drain regions 16 and 18 respectively, separated by a gate electrode 20. The source region 16, the drain region 18 and the gate electrode 20 are formed on a lightly doped silicon substrate 21. The gate electrode 20 is insulated by an insulating layer 23 and covered by a conductive layer 25 formed on top of the insulating layer 23. The gate electrode 20 is surrounded by spacer 17 and 19 which are used as masks for the formation of the source and drain regions 16 and 18. Two surface layers 16' and 18' are formed on top of the source and drain regions 16 and 18 respectively to serve as contact for electrical connection for the source and drain region 16 and 18 to other circuits (not shown) to be fabricated in subsequent manufacturing steps. The doped source and drain regions 16 and 18 are formed by the use of boron compounds containing atoms identical to that of the substrate material. For example, for a silicon substrate, the dopants for the shallow p-type region 22 as that shown in FIG. 1 are doped with compound of $B_xSi_y$, where x and y are the atomic rations of the boron atoms and the silicon atoms contained in the dopant compound respectively. In addition to dopant compounds as disclosed above, a boron compound may contain atoms of substrate material which exist in a stable form, e.g., $B_2Si$, $B_4Si$, and $B_6Si$, not suitable for particular applications. The, boron dopant compounds can also be formed with atoms of material types which have high solubility in the substrate. For example, a dopant compound can be formed as $B_xGe_y$, where the germanium atoms have broad range of solubility in the silicon substrate. An alternate set of preferred dopants for forming a shallow p-type region are ternary boron compounds including atoms of the substrate material and element that forms solid solution with the substrate material, e. g., Ge. A ternary born compound such as $B_xSi_yGe_z$ would be suitable for this application to form shallow p-type regions in a silicon substrate.

Among the boron dopant compounds of $B_xSi_y$, several of these compounds, e.g., $B_2Si$, $B_4Si$, and $B_6Si$, are available commercially. These compounds exist as solid powers at room temperature under atmospheric pressure. As an example, one of these compounds can be implanted in the silicon substrate to form a shallow p-type region by the following processes. A $B_xSi_y$ compound is placed in a Knudsen cell equipped with a small orifice. The Knudsen cell is a vessel used to measure a very low vapor pressure by measuring the weight of vapor, which escapes when the vessel containing a solid or liquid in equilibrium conditions with the vapor. The Knudsen cell is placed in a furnace with a vacuum pump connected thereto. Applying heat to the compound elevates the temperature in the furnace. Depending on the vapor pressure, the boron compound $B_xSi_y$ begins to evaporate above certain temperature. The evaporated compound is directed to effuse in forming a collimated molecular beam. The beam is ionized and accelerated and applied as implanting ion beam to an unmasked area in the silicon substrate. Shallow p-type regions are thus formed with boron dopant selected from one of the composition forms among compounds $B_2Si$, $B_4Si$, or $B_6Si$. In addition to the processing steps as described for preparation of ion sources, a physical sputtering method can also be used. Control and measurement of ion concentrations for different ions including $BSi_2+BSi_2++$, $BSi_3+$, and $Bsi_3++$, can be achieved by the use of secondary ion mass spectroscopy (SIMS). Other ion formation and implantation methods, including plasma ion implantation, electron bombardment ionization, and other types conventional ion source/accelerator combinations can be used to form and accelerate the ions necessary to accomplish the methods disclosed in this patent.

When the shallow p-type regions 16 and 18 are formed with this p-type dopant, the silicon atoms in the composite implanted ion dopant are identical to those silicon atoms in the substrate. The implanted silicon is indistinguishable from the silicon substrate 21. The contact 16' and 18' can be formed and securely bonded to the silicon surface without being separated by the migrating fluorine atoms as that encountered in the prior art. In addition, silicon being much more massive than boron creates damage in the crystalline substrate, thereby minimizing the 'channeling tail' and improving the electrical activation of the implanted boron during subsequent annealing.

Similarly, when the boron-germanium or boron-silicon-germanium compounds are used for implantation into a silicon substrate 21, the germanium atoms, which are implanted in the p-type region, are readily soluble in the silicon substrate. This is because germanium atoms can form a continuous solid solution with silicon over a broad composition range. Furthermore, germanium has similar electrical, physical, and chemical properties as that of silicon. Because of the high solubility, no segregation of germanium occurs in the subsequent processing steps. The electrical and other performance characteristics are not affected due to the presence of the germanium atoms in the p-type region. There is no migration of germanium atoms to the surface at an elevated temperature in the substrate. Thus, contacts or any thin film to be formed on the silicon surface are not affected by the use of the germanium as a part of the dopant compounds. High reliability and controllable, predictable electrical performance characteristics can be achieved by forming the shallow p-type regions via the use of the boron-silicon, boron-germanium or boron-silicon-germanium compounds as dopants.

Figure 2:
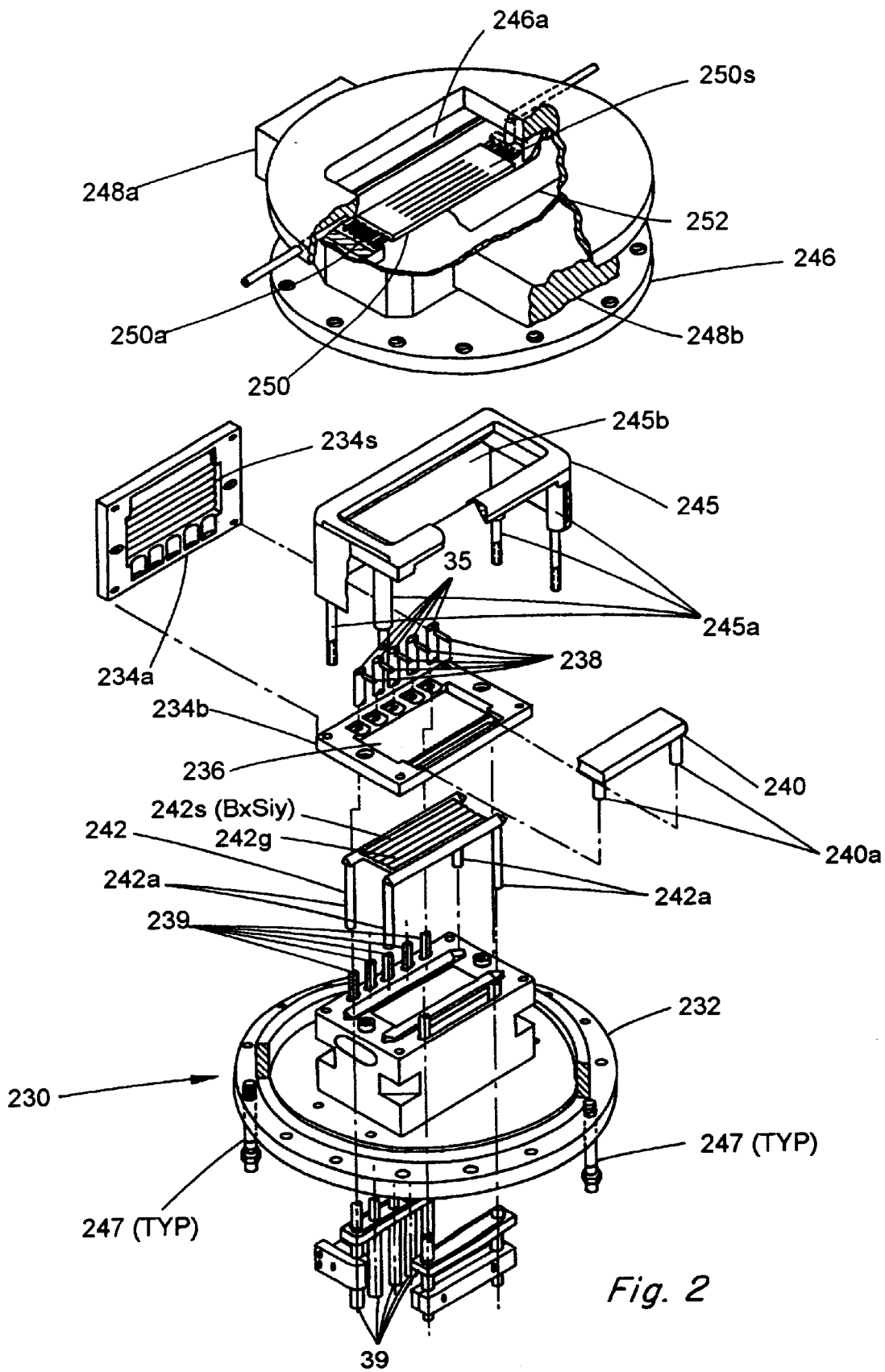
FIG. 2 is a cross sectional view of an ion implantation system of this invention implemented with a novel type of implanting sources.

Many different implantation systems as that disclosed in the prior art can be employed to carry out the implanting processes discussed above. For example a negative ion source with hollow cathode disclosed in U.S. Pat. No. 4,377,773 can be employed as that shown in FIG. 2. Details of FIG. 2 can be referred to FIG. 2 of U.S. Pat. No. 4,377,773. The feed gas is provided from the gas lines 239 to hollow cathodes 238 provided with a plasma electrode 240 and an anode base 232. A RF probe or spark gap carries out the ionization process. The ionized plasma is discharged form the surface 242s of the converter 242 placed in the hollow cathode following the magnetic field. The system further includes a means for extracting the negative ions for implanting a substrate.

The invention thus discloses an ion source apparatus, which includes an anode having an interior space for containing the plasma and an opening into the space. The ion source apparatus further includes a hollow cathode within the space. The ion source apparatus further includes an ion-source composed of compounds comprising element selected from a group of elements consisting of silicon and germanium, the ion dopant source is disposed on the converter 242 in the space for generating ions. The ion source apparatus further includes a voltage means connected to the anode, the hollow cathode, and the p-type ion source for discharging the plasma into the space for bombarding the p-type ion source for generating a p-type ion compound. The ion source apparatus further includes an ion-beam extracting means for extracting the ion dopant compound through the opening. In a preferred embodiment, the anode and the cathode with the voltage means are formed as an ion source of a magnetron type. The dopant ion-source may be a p-type or a n-type dopant ion-source. The dopant ion-source may be a solid dopant ion-source. In a preferred embodiment, the dopant ion-source is a boron germanium dopant ion-source. In a preferred embodiment, the dopant ion-source is a boron silicon dopant ion-source. In another preferred embodiment, the dopant ion-source is a phosphorous germanium dopant ion-source. In another preferred embodiment, the dopant ion-source is a phosphorous silicon dopant ion-source. In another preferred embodiment, the dopant ion-source is a arsenic germanium dopant ion-source. In another preferred embodiment, the dopant ion-source is a arsenic silicon dopant ion-source. In another preferred embodiment, the dopant ion-source is a composite dopant ion-source defined by $A_xC_y$ wherein A representing an acceptor and C representing an element forming a solid solution in a substrate with a solid solubility higher than a solid solubility of a fluorine ion in the substrate, and x and y are real numbers. In another preferred embodiment, the dopant ion-source is a composite dopant ion-source defined by $A_xC_y$ wherein A representing an acceptor and $A_xC_y$ representing a compound of $A_xSi_{y1}Ge_{y2}$ where x, y1 and y2 are real numbers. In another preferred embodiment, the dopant ion-source is a composite dopant ion-source defined by $A_xC_y$ wherein A representing an acceptor and $A_xC_y$ representing a compound of $B_xSi_y$ where x and y are real numbers.

Figure 3:
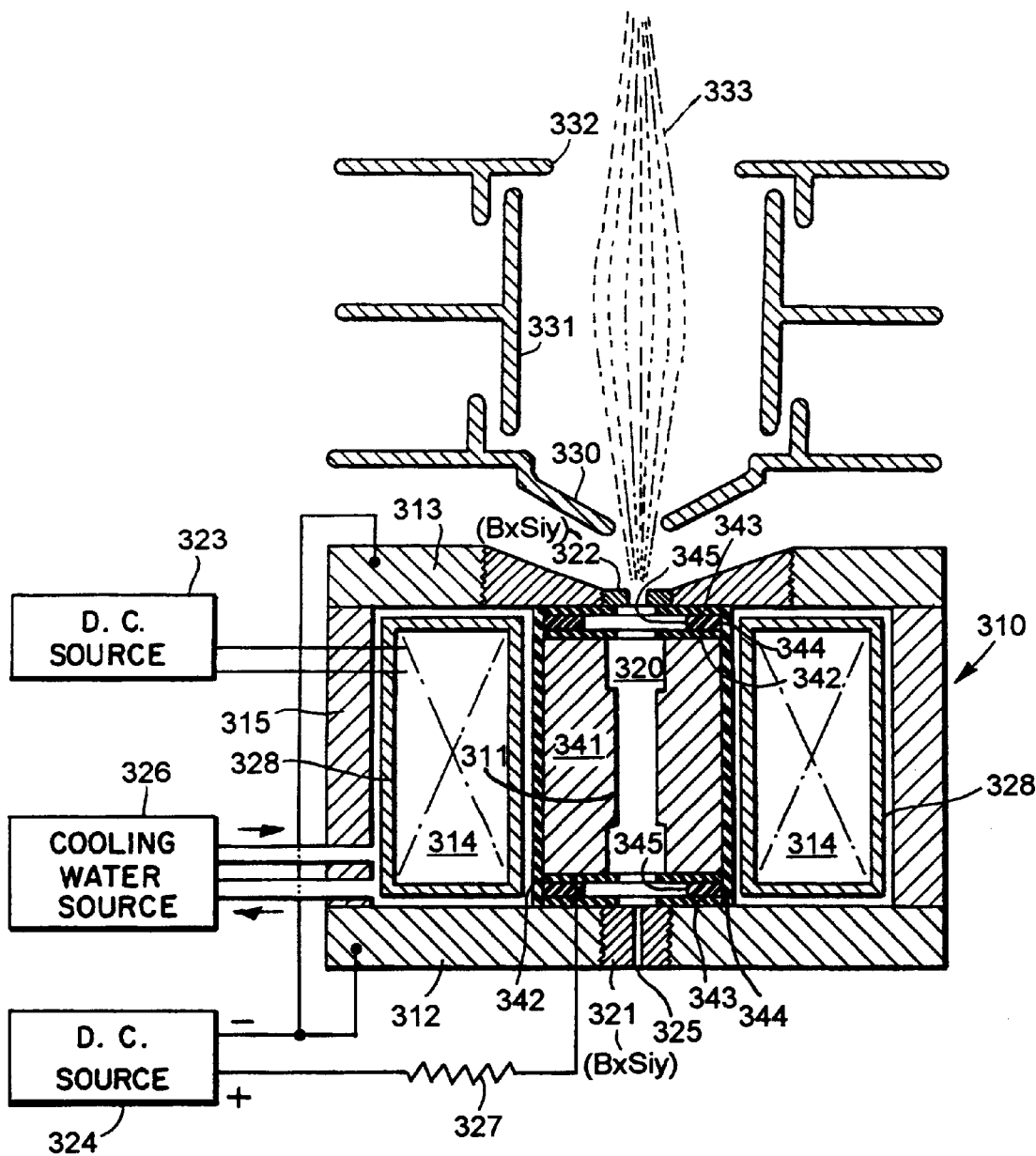
FIG. 3 is a cross sectional view of another ion implantation system of this invention implemented with a novel type of implanting sources.

A cold-cathode ion source as that disclosed by U.S. Pat. No. 3,955,118 may also be employed for the implantation system of this invention. FIG. 3 (FIG. 1 of U.S. Pat. No. 3,955,118) shows the cross section of such a system. The plasma discharge ionizes source feed gas is injected through entry port 325. A coil 314 is powered by a D-C source 323. Another DC source 324, connected through a blaster resistor 327 and an anode 311 with a negative terminal connected to the outer connection portion 310, i.e., cathodes 312 and 313, is employed to supply the plasma discharge. Cathode inserts 321 and 322 composed of p-type ion source materials of this invention composed of element selected from a group of elements consisting of silicon and germanium are used for generating p-type ion compound. The coil 314 is enclosed in the metal housing 328 to supply heat to the plasma discharge chamber 320. Electrodes 330, 331, and 332 serve to extract an ion beam 333 from the plasma discharge chamber 320. The ion beam 333 is then directed to the substrate for carrying out an implantation operation.

Figure 4:
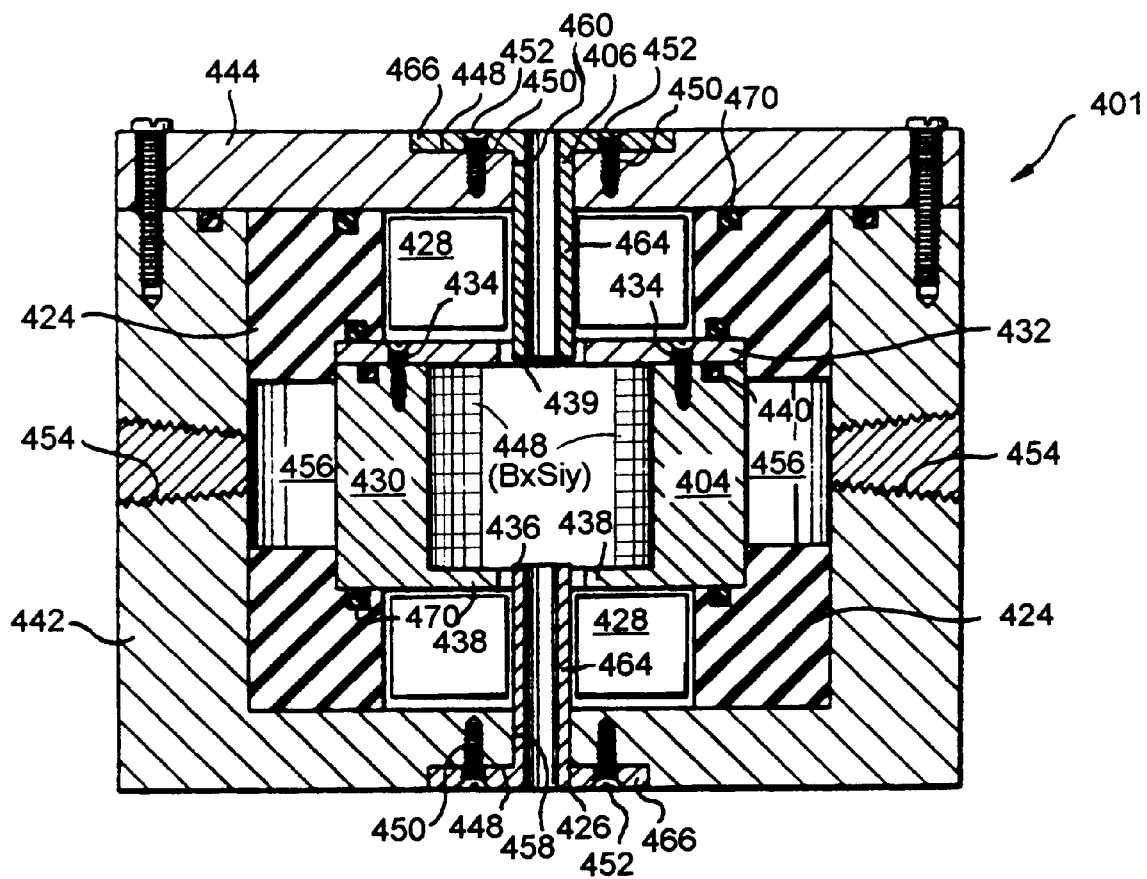
FIG. 4 is a cross sectional view of another ion implantation system of this invention implemented with a novel type of implanting sources.

A hollow-cathode magnetron ion source as that disclosed by U.S. Pat. No. 5,178,743 may also be employed for the implantation system of this invention. FIG. 4 (FIG. 3 of U.S. Pat. No. 5,178,434) shows the cross section of a cylindrical hollow magnetron 401. It includes a cathode 404 and two anode 406 with two electric insulators 424. The magnetron system 401 further includes a back strap 424 and two ring shaped magnets 428. The magnetron system 401 is disposed in a vacuum chamber and back filled with argon gas. A high negative direct-current (dc) voltage, e.g., 300–1000 volts, power supply is connected to the cylindrical cathode 404, a glow discharge plasma is generated within the cavity of the hollow cathode 404. The magnetic flux lines confine most of the plasma near the cathode. For the purpose of generating an implantation ion beam, the energetic positive argon ions from the plasma are accelerated toward the negative potential of the cathode-surface and hit with high energy. The energy exchange between the ions and the cathode surface, atoms are ejected from the surface of the material placed on the surface of the cathode 404. Source materials 488 of this invention such as $B_xSi_y$, $B_xGe_z$, or $B_xSi_yGe_z$ can be placed in the cathode cavity immediate next to the cathode surface for generating the implanting source ions. The implanting ions then biased to travel to the substrate placed in the container 430 (the details of container 430 are shown in FIG. 4 of the U.S. Pat. No. 5,178,743 patent and not included here as the operation and structure are fully described in that reference). The implantation of the substrate by using an ion source of this invention as described above can be accomplished by a magnetron as that shown in FIG. 4.

This invention also discloses an ion source apparatus, which includes a dopant ion-source composed of compounds comprising element selected from a group of elements consisting of silicon and germanium. The ion source apparatus further includes an electron beam device for injecting an electron beam to the dopant ion-source for generating a dopant ion compound. The ion source apparatus further includes an ion-beam extracting means for extracting the dopant ion compound through the opening. This invention further discloses, as another preferred embodiment, an ion source apparatus, which includes a dopant ion-source composed of compounds comprising element selected from a group of elements consisting of silicon and germanium. The ion source apparatus further includes an ion-beam device for injecting an ion beam to said dopant ion-source for generating a dopant ion compound. The ion source apparatus further includes an ion-beam extracting means for extracting said dopant ion compound through said opening.

In summary, this invention teaches a method of manufacturing a semiconductor devices which include a p-type region. The method includes the step of: (a) providing a substrate composed of a material represented by a symbol C; and (b) placing a p-type ion source in an ion source apparatus wherein the p-type ion source composed of $A_xC'$ wherein A represents an acceptor and C' represents an element for forming a solid solution in the substrate and having a solid solubility higher than a solubility of a fluorine ion in the substrate where x and y are real numbers; (c) generating an ion compound of $A_xC'$ in the ion source apparatus; and (d) extracting the ion compound of $A_xC'$ for implanting the substrate to form the p-type regions.

In another method, the step (a) of providing a substrate is accomplished by providing a silicon substrate; and the step (b) of implanting the source/drain a combination dopant including $A_xSi_y$ where x and y are real numbers. In an alternate method, the step (a) of providing a substrate being accomplished by providing a silicon substrate; and the step (b) of implanting the source/drain a combination dopant $A_xC'$ being a step of implanting the substrate a dopant compound including $A_xGe_y$ where x and y are real numbers. In yet another method, the step (a) of providing a substrate is accomplished by providing a silicon substrate; and the step (b) of implanting said source/drain a combination dopant including $A_xSi_{y1}Ge_{y2}$ where y1 and y2 are real numbers.

This invention also discloses a method for creating a doped region in a semiconductor device supported on a substrate. The method includes the steps of (a) selecting the compound containing atoms having high solid solubility in the substrate; (b) energizing the compound and introducing the compound into the substrate as energized ions; and (c) maintaining an atomic concentration of each of the atoms in the substrate below a solid solubility for each of the atoms in the substrate whereby a defect in the substrate is prevented thereby.

In an alternate preferred embodiment, the present invention further teaches a method of performing a plasma ion implantation for introducing a compound into substrate. The method includes the steps of: (a) selecting several atoms for making the compound wherein each of the several atoms having high solid solubility in the substrate; (b) introducing a gas flow for each of the atoms into a plasma generating chamber for generating the compound in a plasma form; (c) energizing the plasma compound and introducing the compound into the substrate as energized ions; and (d) maintaining an atomic concentration of each of the atoms in the substrate below a solid solubility for each of the atoms in the substrate whereby a defect in the substrate is prevented thereby.

In addition to the dopant compounds described above, a series of compounds, including but not limited to compounds such as boron-Sn and boron-Pb, can also be used to create the shallow p-type regions. The non-born atoms in these compounds are highly soluble in the silicon substrate. The undesirable effects of segregation and migration are eliminated when solid solutions are formed in the silicon substrate.

The implantation methods described above are for the fabrication of a MOSFET device. The dopants and techniques described for forming shallow p-regions however are applicable to a wide ranger of devices. To those of ordinary skill in the art, it is obvious how to apply these techniques to devices such as bipolar, pnp transistors, the integrated injection logic (I2L), GaAs devices, i. e., the II–IV semiconductors, silicon-on-insulator (SOI) devices, etc. In addition to transistors, such technology is also applicable for fabrication of diffused capacitors, resistors and other types of circuit components whenever shallow p-type of doped regions are involved. In addition to form the shallow p-type regions, the technique disclosed in this invention can also be applied to for the purpose to form a shallow n-type regions. Dopant ion compounds such as phosphorous germanium, phosphorous silicon, arsenic germanium, and arsenic silicon can also be produced for manufacturing a semiconductor device with shallow n-type of regions. Additionally, according to this invention, dopant ion compounds listed above compounded with hydrogen element can also be implanted for the purpose of making shallow regions.

This invention thus teaches a method for fabricating a semiconductor device with shallow p-type regions. The shallow depth of the p-type regions is achieved by the use of $B_xSi_y$, or boron-germanium or boron-silicon-germanium compounds as the implanted compounds. A new dopant and fabrication process of forming a shallow p-type region for a semiconductor device are herein provided to overcome the difficulties encountered in the prior art The p-type dopant for fabrication of IC devices with shallow-depth p-type regions which are provided wherein allow the fabrication process to be better controlled and will produce a p-region with a well-defined and reproducible shallow-depth and having uniform diffusion profile useful to enhance the miniaturization of the IC devices. The disadvantages of prior art devices including problems of weak adhesion, poor contact, surface gap, uncertain performance variations, unpredictable electrical characteristics, and poor reliability caused by fluorine migration are therefore resolved. The shallow-depth p-type regions that are formed wherein have the advantage that the depth of p-region is reduced while contacts on the surface can be fabricated with strong adhesion and have low contact resistance with predictable and well-defined performance characteristics. Furthermore, a p-type dopant for fabrication of IC devices with shallow-depth p-type regions are provided wherein which help reduce the epitaxial growth at the interface between silicon and aluminum alloy containing silicon.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An ion source apparatus comprising:
    an anode having an interior space for containing a plasma and an opening into said space;
    a hollow cathode within said space;
    a dopant ion-source composed of compounds comprising at least one element selected from a group of elements consisting of silicon and germanium, said dopant ion-source disposed next to said space;
    a voltage means connected to said anode, said hollow cathode, and said dopant ion source for discharging a plasma into said space for bombarding said dopant ion source for generating a dopant ion compound;
    an ion-beam extracting means for extracting said dopant ion compound comprising at least one element selected from a group of elements consisting of silicon and germanium through said opening.
2. The ion source apparatus of claim 1 wherein:
    said anode and said cathode with said voltage means are formed as an ion source of a magnetron type with said dopant ion source disposed immediate next to an electrode of said hollow cathode.
3. The ion source apparatus of claim 1 wherein:
    said dopant ion-source is a p-type dopant ion-source.
4. The ion source apparatus of claim 1 wherein:
    said dopant ion-source is a n-type dopant ion-source.
5. The ion source apparatus of claim 1 wherein:
    said dopant ion-source is a solid dopant ion-source.
6. The ion source apparatus of claim 3 wherein:
    said dopant ion-source is a $B_xGe_y$ dopant ion-source where x and y are real numbers.
7. The ion source apparatus of claim 3 wherein:
    said dopant ion-source is a $B_xSi_y$ dopant ion-source where x and y are real numbers.
8. The ion source apparatus of claim 4 wherein:
    said dopant ion-source is a $P_xGe_y$ dopant ion-source where x and y are real numbers.
9. The ion source apparatus of claim 4 wherein:
    said dopant ion-source is a $P_xSi_y$ dopant ion-source where x and y are real numbers.
10. The ion source apparatus of claim 4 wherein:
    said dopant ion-source is a $As_xGe_y$ do pant ion-source where x and y are real numbers.
11. The ion source apparatus of claim 4 wherein:
    said dopant ion-source is a $As_xSi_y$ dopant ion-source where x and y are real numbers.
12. The ion source apparatus of claim 3 wherein:
    said dopant ion-source is a composite dopant ion-source defined by $A_xC_y$ wherein A representing an acceptor and C representing an element forming a solid solution in a substrate with a solid solubility higher than a solid solubility of a fluorine ion in said substrate, and x and y are real numbers.
13. The ion source apparatus of claim 3 wherein:
    said dopant ion-source is a composite dopant ion-source defined by $A_xC_y$ wherein A representing an acceptor and $A_xC_y$ representing a compound of $A_xSi_{y1}Ge_{y2}$ where x, y1 and y2 are real numbers.
14. The ion source apparatus of claim 3 wherein:
    said dopant ion-source is a composite dopant ion-source defined by $A_xC_y$ wherein A representing an acceptor and $A_xC_y$ representing a compound of $B_xSi_y$ where x and y are real numbers.

* * * * *